United States Patent [19]

Bonner

[11] Patent Number: 5,168,235
[45] Date of Patent: Dec. 1, 1992

[54] TOOL FOR ALIGNING AND MANIPULATING AN ELECTRICAL OUTLET WITH REMOVABLE PLATE SHIELD FOR PREVENTING SHORT CIRCUITS

[76] Inventor: Melvin Bonner, 5555 W. 174th St., Tinley Park, Ill. 60477

[21] Appl. No.: 790,249

[22] Filed: Nov. 12, 1991

[51] Int. Cl.$^5$ .......................... G01R 31/02; G01C 9/24
[52] U.S. Cl. .................... 324/508; 340/656; 33/379
[58] Field of Search .......................... 324/508; 340/656; 33/374, 389

[56] References Cited

U.S. PATENT DOCUMENTS 3,279,080 10/1966 Stepshinski ........................ 33/379 X
4,082,995 4/1978 Rhude ................................ 324/508
4,164,702 8/1979 Pereda ............................... 324/508

FOREIGN PATENT DOCUMENTS 0804773 1/1969 Canada ................................ 324/508

Primary Examiner—Gerard R. Strecker
Assistant Examiner—Diep Do
Attorney, Agent, or Firm—Gary J. Cunningham

[57] ABSTRACT

This invention relates to a tool for aligning and manipulating an electrical outlet comprising: a base member including a top portion and bottom portion, front portion and rear portion, the rear portion including plugs for plugging into the electrical outlet; and a removable shield for minimizing the possibility of shorting out an electrical connection of the outlet with a metallic junction box during installation for example, the removable shield and the base member being coupled together or released.

15 Claims, 2 Drawing Sheets

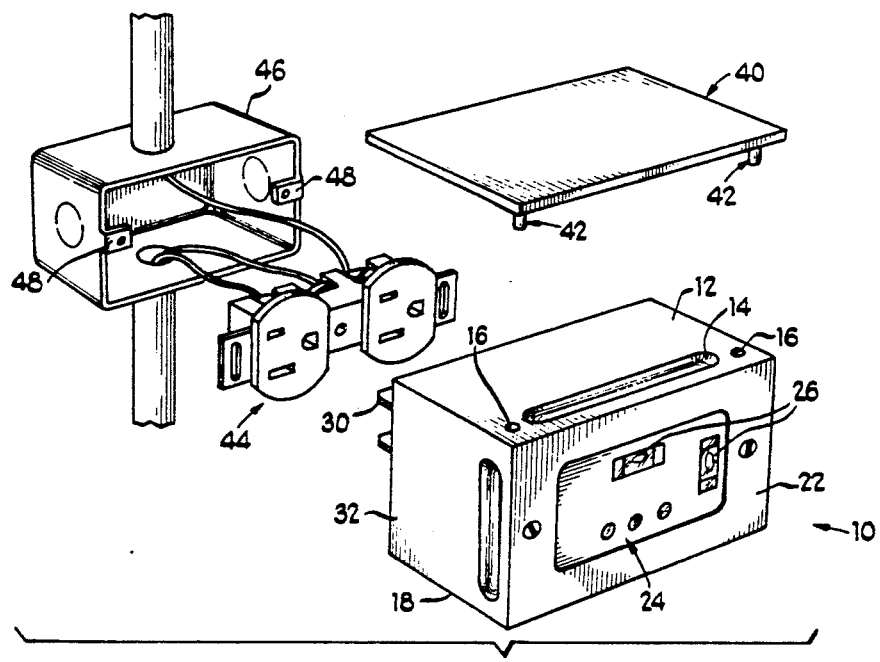
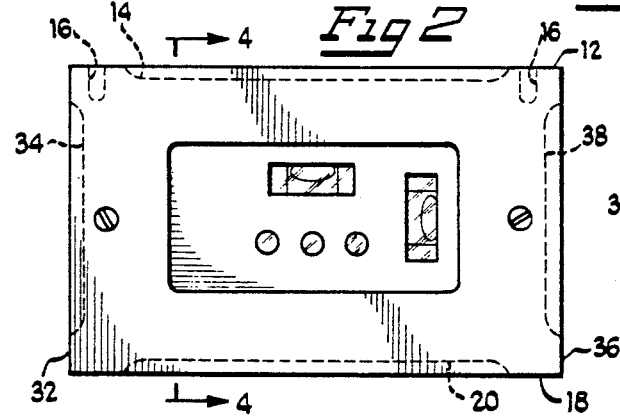
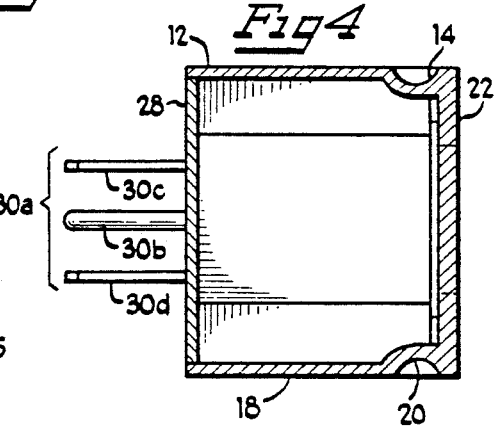
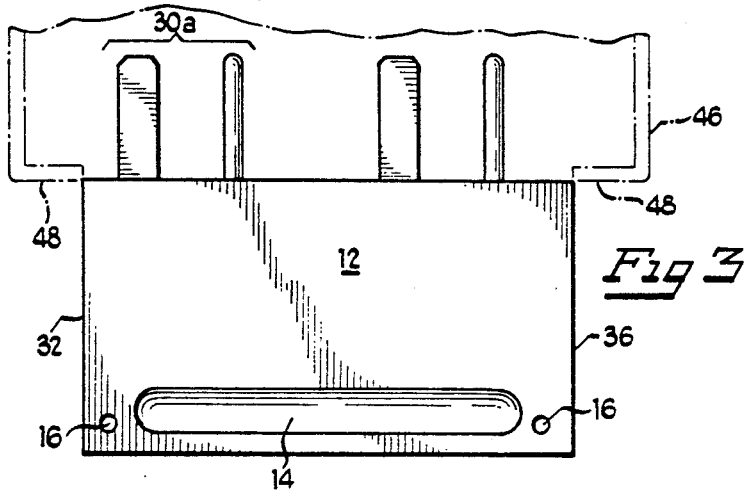

| 1=ON  0=OFF | | Y | R | C | |
|---|---|---|---|---|---|
| | EX.1 | 1 | 0 | 1 | CORRECT |
| | EX.2 | 1 | 0 | 0 | OPEN GRD |
| | EX.3 | 1 | 1 | 0 | REV POLARITY |
| | EX.4 | 0 | 0 | 0 | OPEN HOT |
| | EX.5 | 0 | 0 | 1 | OPEN NEUTRAL |
| | EX.6 | 0 | 1 | 1 | HOT & GRD REV. |
| | EX.7 | 0 | 1 | 0 | HOT ON NEUTRAL W/HOT OPEN |

TOOL FOR ALIGNING AND MANIPULATING AN ELECTRICAL OUTLET WITH REMOVABLE PLATE SHIELD FOR PREVENTING SHORT CIRCUITS

FIELD OF THE INVENTION

This invention relates to an alignment tool for manipulating electrical outlets, comprising a base member including a top portion and bottom portion, front portion and rear portion, and side portions, said rear portion including outwardly extending plugs.

BACKGROUND OF THE INVENTION

There is a great variety of tools for picking up and manipulating small objects, arranging for example from the simplest tongs and magnetized screwdrivers to extremely complex remote control arms. Many of these tools, such as tongs or pliers, require that the operator maintain his grip on the work piece being handled. Others, such as certain forceps and locking pliers, can be locked in a closed position on the piece being handled. Many of the locking manipulative tools are relatively large, clumsy, otherwise not particularly well-adapted for manipulation of small electrical components, or too expensive for the task. As background, see for example U.S. Pat. No. 4,605,256 which is directed to a locking tool for manipulation of electronic components, and U.S. Pat. No. 3,896,533, which is directed to a tool for inserting and removing circuit components.

Electrical outlets are frequently crowded environments in which it can be dangerous or difficult to handle components with the fingers. Accordingly, it is desirable to have tools which are small or portable, easily operable and manipulated by one hand, and which can grasp electrical components firmly, capturing them so that they can be manipulated in any orientation for installing and testing or removing electrical outlets from junction boxes. The tool of the present invention admirably fulfills these requirements. It is simple, easily operable by one hand, can be interconnected with the work piece being handled, and is able to capture and retain the electrical work piece being handled until the operator chooses to disconnect the tool from the work piece.

SUMMARY OF THE INVENTION

The alignment tool of the instant invention is utilized for installing, traveling and/or testing electrical outlets, and comprises an alignment tool for manipulating electrical outlets, comprising a base member including a top portion and bottom portion, front portion and rear portion, and side portions, said rear portion including outwardly extending plugs.

An embodiment of the tool comprises an alignment tool for manipulating electrical outlets, comprising: a base member including a top portion and bottom portion, front portion and rear portion have outwardly extending plugs, and a removable shield including an interconnected position wherein said shield is interconnected to said top portion of said base member and a released position.

An object of the instant invention is to provide a tool for manipulating and installing electrical outlets, which is portable, compact lightweight, durable, substantially insensitive to shock, simple in construction, inexpensive and easy to assemble.

A further object of the invention is to provide an alignment tool for manipulating electrical outlets which is particularly adapted to being mass produced.

Yet another object of the instant invention is to provide an alignment tool which will allow an installer to be more productive, by allowing such operator to install and test the polarity of an electrical outlet in one easy step.

BRIEF DESCRIPTION OF THE DRAWINGS

FIG. 1 is a perspective view of the tool for installing electrical outlets in accordance with the principles of the present invention.

FIG. 2 is an enlarged front view of the tool of FIG. 1 in accordance with the principles of the present invention.

FIG. 3 is a top view of the tool of FIG. 1 in accordance with the principles of the present invention.

FIG. 4 is an enlarged cross-sectional view of the tool of FIG. 2 taken substantially along line 4—4 of FIG. 2 in accordance with the principles of the present invention.

DESCRIPTION OF THE PREFERRED EMBODIMENT

Figures 5, 6:
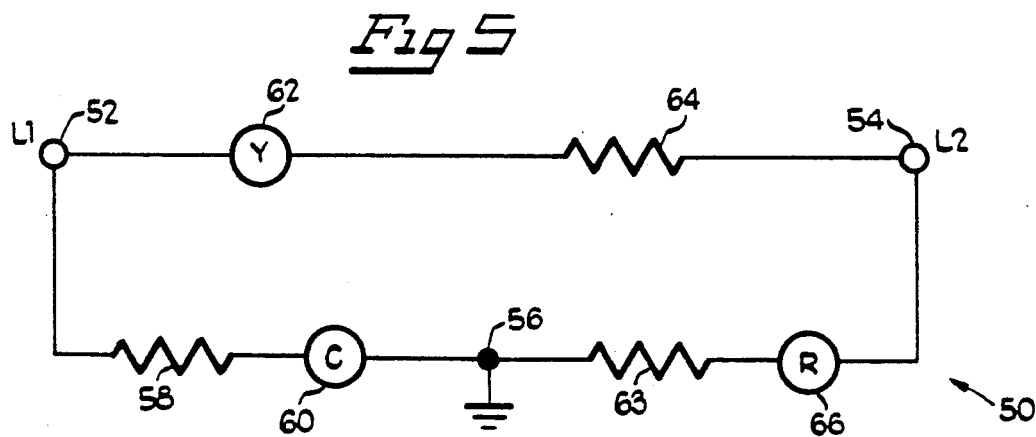
FIG. 5 is a schematic view of a component of the tool of FIG. 1 in accordance with the principles of the present invention.
FIG. 6 is a table in connection with the diagnostic structure of the tool of FIG. 1, for indicating whether an electrical outlet is properly wired or not, and if not, how to correct the wiring.

While this invention is susceptible of embodiments in many forms, there is shown in FIG. 1 an embodiment suitable for use in the practice of this invention, with the understanding that the present disclosure is not intended to limit the invention to the embodiment illustrated.

Illustrated in FIG. 1, is a tool for installing, testing, aligning and leveling electrical outlets. It includes a base member 10 including a top portion 12 and bottom portion 18 front portion 22 and rear portion 28, and side portions 32 and 36, said rear portion 28 including plugs 30.

More particularly, the top portion 12 of the base member 10 includes a handle means 14 which is indented or substantially grooved and adapted to receive a persons fingers or thumb comfortably. The top portion 12 also includes interconnecting means 16 for connecting a shield 40 to the base member 10. In a preferred embodiment, the interconnecting means 16 includes an indentation or female portion adapted to receive a male portion. Like the top portion 12, the bottom portion 18 also includes a handle means 20 adapted to allow a technician to comfortably grasp and manipulate the tool. In a preferred embodiment, the handle means 14 and 20, are situated substantially in the same place on top and bottom portions 14 and 18, respectively, and are substantially adjacent and substantially traverse across a major portion of such portions 12 and 18.

Referring to FIG. 2, in a preferred embodiment the front portion 22 includes indicating means 24 and level means 26. The indicating means 24 indicates whether the neutral, positive, and negative lines are appropriately installed when power is applied. The level means 36 indicates whether an outlet, such as 44 after installation, is leveled appropriately.

Referring to FIG. 3, the rear portion 28 includes at least one set of outwardly extending conventional plugs 30. In a preferred embodiment, plugs 30 can include a first set 30a and second set 30b of conventional plugs, for improved interconnection of the tool to the outlet 44.

The first side and second side portions 32 and 36, each include handle means 34 and 38, for improved manipulation of the tool. The handle means 34 and 38 include parallel grooves or the like, for improved manipulation of the tool. The handle means 34 and 38 have been configured so as to conform to a technicians fingers and/or thumbs and extend across most of side portions 32 and 36.

In a preferred embodiment, the tool includes a shield, plate or cover 40, which is configured with interconnecting means for interconnecting the shield 40 to the base member 10. The interconnecting means 42 includes a male portion, configured to be received in the interconnecting means or female portion 16 of the top portion 12 of base member 10.

It should be understood by those skilled in the art, that the instant invention is not limited to use in dual outlets, and is easily adapted to being used in other outlets and applications.

In a preferred embodiment, the alignment tool base member 10 and plate 40 are made of any material which is substantially nonconductive and resilient to damage, cracking or chipping. Preferably a thermoplastic material which has sufficient mechanical strength is used.

At construction sites, for example, many times electrical power is turned on while electricians or technicians install outlets. In normal operation, the base member 10 of the tool, plugs 30 are inserted or plugged into dual outlet 44 in a conventional manner. Next, the installer strips the wires and connects them in a conventional manner to the dual outlet 44, often while the power is on. Next, the installer tests the outlet 44 by inspecting the indicating means 24, to determine whether it is properly wired, such as whether the power, neutral and ground are properly connected to outlet 44. After the installer determines the outlet 44 is properly wired, the shield 40 interconnecting means 42 is interconnected to the top portion 12 of the base member 10, and the tool is inserted partially into the junction box 46, in FIG. 1, which is adapted to receive the dual outlet 44. The shield is nonconductive thereby helping to minimize the possibility of shorting out the electrical connections of outlet 44 with the metallic junction box 46. Referring to FIGS. 1 and 3, the tool has been designed so as to allow access to the screw receiving tabs 48 to facilitate installation and interconnection of dual outlet 44 to junction box 46. The level means 26 is utilized to level the dual outlet 44 when screwed to box 46. After the dual outlet 44 is screwed into the junction box 46, the base member 10 and shield 40 are removed and-/or unplugged by the installer, to allow the installation of the face plate substantially over the dual outlet 44. The shield 40 of the instant invention, allows the installer to insert the dual outlet 44 while the power is on, with minimal chances of shorting out the live wires within junction box 46.

The instant invention allows an installer to be more productive by installing more outlets in a shorter period of time, by making it less likely that the dual outlet 44 will short out or shock the installer when being inserted into the junction box 46, because the shield 40 helps to minimize this possibility and the leveling means 26 helps to level the outlet 44. Since the chances of the installer being shocked is diminished, the installer can work faster and more efficiently.

In a preferred embodiment, the invention includes diagnostic means or an electrical circuit 50 for helping a technician to trouble shoot or determine if the outlet is properly wired or not, and if not how to correct it as illustrated in FIG. 5.

In a preferred embodiment, diagnostic means 50 comprises indicating means for indicating whether an outlet is properly wired and protective means for protecting diagnostic means 50 if outlet 44 is wired improperly. Preferably, indicating means comprises light indicated as yellow "Y", red "R" and clear "C" in FIGS. 1 and 2, which are utilized to indicate whether an outlet is properly wired or not, and if not properly wired, how to correct such wiring. Preferably, protective means comprise at least one resistor in series with each of light Y, R and C to protect diagnostic means 50 in the case of, for example, shorting out or improper wiring.

Referring to FIGS. 4 and 5, the plugs 30a components 30c, 30d and 30b are electrically connected to line one 52, line two 54, and ground 56, respectively. L1 52 is typically connected to power and L2 54 is typically connected to neutral. Moving from L1 52 to ground 56, is a resistor 58 and indicating means or light 60. In a preferred embodiment, the resistor 50 is a 22,000 ohm resistor and light 60 is clear. Moving from L1 52 to L2 54 is an indicating means or light 62 and resistor 64. In a preferred embodiment, resistor 64 is a 20,000 ohm resistor and light 62 is yellow. And finally, going from L2 54 to ground 56 is indicating means or light 66 and resistor 68. Resistors 58, 64 and 68 are utilized to protect the diagnostic means or circuit 50 in the case of shorting out the power line of L1 52 with neutral 54 or ground 56.

Referring to FIG. 5, diagnostic means 50 allows a technician to trouble shoot and determine what if anything is wrong with the wiring of an outlet 44. Referring to FIG. 6, Example 1 illustrates the case when an outlet is properly wired. Power such as 120 volts is applied at L1 52 and neutral is applied at L2 54. In this case, a voltage will travel from L1 52 through light 62 and resistor 64 to neutral 54 turning light 62 on, as well as a voltage will travel from L1 52 through resistor 58 and light 60 to ground 56 to turn light 60 on. Since there is substantially no voltage difference from L2 54 to ground 56, light 66 is not energized.

In example 2, power is applied to L1 52 and neutral is connected to L2, but ground is not connected to ground 56. In this case, a voltage will travel from L1 52 through light 62 and resistor 64 to L2 neutral 54, resulting in turning light 62 on. Lights 60 and 66 are not lit because a live circuit is missing since the ground 56 is disconnected. To correct this condition, a ground wire needs to be connected to ground 56.

In example 3, L1 52 and L2 54 are reversed, or neutral is applied to L1 52 and power to L2 54. If this occurs, lights 62 and 66 will light because voltage travels from L2 54 through resistor 64 and light 62 to neutral L1 52 and also travels from L2 54 through light 66 and resistor 68 to ground 56. To correct this condition the wires connected to L1 52 and L2 54 need to be reversed, as in example 1.

In example 4, power is not applied to L1 52 and neutral is not applied to L2 54, and ground 56 may or may not be properly grounded. In this case, none of lights 60, 62 and 66 light because there is no live circuit. To remedy this, power needs to be applied to L1 52 and neutral to L2 54 and ground to ground 56.

In example 5, power is applied to L1 52 and ground to ground 56, but neutral is not applied to L2 54. In this case, a voltage travels from L1 52 through resistor 58 and light 60 to ground 56. Lights 62 and 66 do not light because the circuit from L1 52 to L2 54 and L2 54 to ground 56, are both open since L2 54 is not properly connected to neutral. To correct this, the neutral wire must be connected to L2 54.

In example 6, L1 52 and ground 56 are reversed so that L1 52 is grounded and power is wired to ground 56. In this case, voltage travels from ground 56 through light 60 and resistor 58 to L1 52 which is grounded, as well as traveling from ground 56 through resistor 68 and light 66, to power lights 60 and 66 on. To correct this situation, the wires connected to L1 52 and ground 56 must be reversed.

In example 7, power is wired to L2 54 and ground 56 is properly grounded, and L1 52 is left open. In this case, voltage travels from L2 54 through light 66 and resistor 68 to ground 56, turning light 66 on. To remedy this situation, power is connected to L1 52 and neutral applied to L2 54.

In a preferred embodiment, audible means can be used in addition to the lights to give off a predetermined tone indicating proper or improper wiring of neutral, power and ground.

Although specific embodiments of this invention have been shown and described, it is to be understood that various modifications and substitutions, as well as rearrangements and combinations of the preceding embodiments, can be made by those skilled in the art without departing from the novel spirit and scope of this invention.

That which is claimed is:

1. A tool for aligning and manipulating an electrical outlet comprising:
   a base member including a top portion and bottom portion, front portion and rear portion, said rear portion including plug means for plugging into the electrical outlet for alignment, manipulation or installation thereof; and
   removable shield means for minimizing the possibility of shorting out electrical connections of the outlet with a metallic junction box, including a substantially flat plate, said removable shield and said base member including interconnectable means for interconnecting said shield with the base member, having an interconnecting position wherein said shield is interconnected with said base member substantially installing the electrical connections of the outlet from the metallic junction box during alignment, manipulation or installation of the outlet in the metallic junction box and a released position wherein said shield is not interconnected with said base member.

2. The tool of claim 1, wherein said top portion of said base member and said shield are interconnected to each other.

3. The tool of claim 1, wherein said top portion of said base member includes interconnecting means for connecting said shield to said base member.

4. The tool of claim 1, wherein said top and bottom portions include handle means along a portion thereof.

5. The tool of claim 1, wherein said base member has side portions including handle means along a portion thereof.

6. The tool of claim 1, wherein said base member and said shield comprise a substantially nonconductive material.

7. The tool of claim 1, wherein said front portion includes a leveling means to level said tool.

8. The tool of claim 1, wherein said base member includes diagnostic means to determine whether an outlet has been properly wired or not.

9. The tool of claim 1, wherein said base member is generally rectangular.

10. The tool of claim 1, wherein said plugs comprise a substantially conductive material.

11. The tool of claim 8, wherein said diagnostic means comprises indicating means for indicating whether an outlet has been properly wired or not.

12. The tool of claim 8, wherein said diagnostic means comprises protective means for protecting said diagnostic means.

13. A tool for aligning and manipulating an electrical outlet comprising:
   a base member including a top portion and bottom portion, front portion and rear portion having outwardly extending plugs for plugging into the electrical outlet for alignment, manipulation or installation thereof, and
   removable shield means for minimizing the possibility of shorting out electrical connections of the outlet with a metallic junction box, including a substantially flat plate, said removable shield means and said base member including interconnectable means for interconnecting said shield with said base member, including an interconnected position wherein said shield means is interconnected to said top portion of said base member for substantially insulating the electrical connections of the outlet from the metallic junction box during alignment, manipulation or installation of the outlet in the metallic junction box and a released position wherein said shield is not interconnected with said top portion of said base members.

14. The tool of claim 13, wherein said base member includes leveling means to help a technician level an outlet.

15. The tool of claim 13, wherein said base member includes diagnostic means comprising indicating means for indicating whether an outlet has been properly wired or not and protective means for protecting said diagnostic means.

* * * * *